(12) United States Patent
Negishi

(10) Patent No.: US 6,487,075 B2
(45) Date of Patent: Nov. 26, 2002

(54) DUSTPROOF STRUCTURE OF COMMUNICATION DEVICE, USING AIR FILTER HAVING DISTRIBUTED DUST COLLECTING EFFICIENCY AND PRESSURE LOSS

(75) Inventor: Masayuki Negishi, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/983,729

(22) Filed: Oct. 25, 2001

(65) Prior Publication Data

US 2002/0036886 A1 Mar. 28, 2002

Related U.S. Application Data

(62) Division of application No. 09/473,016, filed on Dec. 28, 1999, now Pat. No. 6,310,770.

(30) Foreign Application Priority Data

Dec. 28, 1998 (JP) ............................................. 10-374602

(51) Int. Cl.[7] ................................................. H05K 7/20
(52) U.S. Cl. ........................... 361/695; 55/471; 55/473; 454/184
(58) Field of Search ........................... 454/184; 361/695, 361/678; 174/16.1; 55/385.2, 385.4, 471, 473

(56) References Cited

FOREIGN PATENT DOCUMENTS

| JP | 60-183623 |   | 9/1985 |
| --- | --- | --- | --- |
| JP | 62-175987 |   | 8/1987 |
| JP | 63-220600 |   | 9/1988 |
| JP | 4-43245 |   | 2/1992 |
| JP | 4-110054 |   | 4/1992 |
| JP | 4-362970 | * | 12/1992 |
| JP | 6-59550 |   | 3/1994 |
| JP | 7-16421 |   | 1/1995 |
| JP | 7-29010 |   | 4/1995 |
| JP | 9-206568 |   | 8/1997 |
| JP | 10-47723 | * | 2/1998 |

* cited by examiner

Primary Examiner—Harold Joyce
(74) Attorney, Agent, or Firm—Foley & Lardner

(57) ABSTRACT

A dustproof structure for a communication device is disclosed, in which the whole area of the air filter can be effectively used, the dust collecting efficiency can be improved at low cost, and an increase in the pressure loss can be prevented. The air filter comprises a first air filter section and a second air filter section, wherein the first air filter section is provided at an area closer to the fan, within which the air flow is concentrated, and the second air filter section is provided at another area farther from the fan, and the first air filter section has a dust collecting efficiency higher than that of the second air filter section, while the second air filter section has a pressure loss lower than that of the first air filter section.

3 Claims, 7 Drawing Sheets

VENTILATION DIRECTION OF FAN

VENTILATION DIRECTION OF FAN

DUSTPROOF STRUCTURE OF COMMUNICATION DEVICE, USING AIR FILTER HAVING DISTRIBUTED DUST COLLECTING EFFICIENCY AND PRESSURE LOSS

CROSS-REFERENCE TO RELATED PATENT APPLICATIONS

This application is a division of application Ser. No. 09/473,016, filed Dec. 28, 1999, U.S. Pat. No. 6,310,770, and related to two concurrently filed applications, both entitled: Dustproof Structure of Communication Device, Using Air Filter Having Distributed Dust Collecting Efficiency and Pressure Loss, and based on Japanese Patent Application No. 10-374602, filed Dec. 28, 1998, by Masayuki Negishi. This application claims only subject matter disclosed in the parent application and therefore presents no new matter.

BACKGROUND OF THE INVENTION

1. Field of the Invention

The present invention relates to a dustproof structure for a communication device which has both an air cooling function and a dustproof function using an air filter, and in particular, to a dustproof structure employing an economical air filter arrangement having a high efficiency.

This application is based on Patent Application No. Hei 10-374602 filed in Japan, the contents of which are incorporated herein by reference.

2. Description of the Related Art

When a generally-known communication device having a shelf which contains a plurality of printed circuit boards is operated, electronic components, electronic circuits, a power supply, and the like generate heat, and relevant thermal stress degrades the reliability of the device. Therefore, it is necessary to cool the heated portions and discharge heat to the outside. Two kinds of cooling methods are known: natural air cooling and forced air cooling. In a modern communication device having a high thermal density, the forced air cooling using a fan is commonly used.

There are two types of forced air cooling using a fan. One is the draw-in method in which the fan is arranged at the exhaust side so that the air inside the chassis is drawn in and then expelled (or vented or exhausted) outside, and the other is the forcing method in which the fan is arranged at the suction side so that the outside air is forcibly introduced into the chassis.

If dust comes into the communication device, it may lead an undesirable effect such as contact failure, insulation failure, promotion of corrosion, degradation of the cooling effect, or the like. Therefore, if the communication device is used in a dusty area, a dustproof structure is necessary. For example, an air filter for filtering cooled air may be provided at the suction side. Japanese Unexamined Patent Application, First Publication, No. Sho 60-183623, discloses an example of the draw-in cooling method and a dustproof structure using an air filter.

Below, the above two forced air cooling methods will be compared in consideration of the dustproof effect. In the draw-in method, an air filter is provided at the air inlet, thereby preventing dust from flowing from the inlet into the chassis; however, air that does not pass through the air filter will flow through a gap or the like into the chassis together with dust. In the forcing method, an air filter is provided at the air inlet and all the air forced into the chassis passes through the air filter; thus, if the performance of the air filter is excellent, the reduction of dust introduced into the chassis can be maximized. Therefore, the forcing method is much more effective than the suction method in consideration of the dustproof effect.

Next, the air filter will be examined. Dust particles included in an air flow collide with and adhere to an air filter, and thereby the dust is removed. A fibrous material, nonwoven fabric, porous plastics, wire gauze, sintered metal, or the like can be used for manufacturing the air filter. The dust collecting efficiency and pressure loss are practical indices indicating the performance of the air filter. Generally, the higher the dust collecting efficiency, the greater the pressure loss is. An air filter having a higher dust collecting efficiency is effective for reducing the introduced dust. However, in this case, the pressure loss is also increased, which imposes a great burden on the air blowing system of the device.

Below, the air flow generated by the fan will be examined. In most cases, the wind blown from the fan does not have a uniform velocity distribution. For example, in the vicinity of the rotational shaft of the axial fan, an area having an extremely small wind velocity is present. Also in the axial fan, the spread of the ventilated area in the radial direction with respect to the rotational shaft is not very large, and the closer the area is to the fan, the more significant this tendency is. That is, in the vicinity of the fan, the spread of the ventilated area is hardly observed, and thus the cross-sectional area of the air flow is approximately equal to the projected area of the fan.

Accordingly, as for the forced air cooling method in consideration of the dustproof effect, the forcing method is much more effective. However, in the forcing method, the air filter is provided immediately below the fan, that is, positioned close to the fan. Such an arrangement makes the air flow concentrate at a part of the air filter.

In order to improve the dust collecting efficiency, it is important to effectively use the whole face or area of the air filter, and also to reduce the pressure loss as much as possible. A high-performance air filter having a high dust-collecting efficiency and relatively small pressure loss may be used; however, such a high-performance air filter is expensive and thus has a low economical efficiency.

Accordingly, a developed air-filter structure is required, whose whole area can be effectively used, and which has a higher dust collecting efficiency and a lower pressure loss at low cost.

FIGS. 7 and 8 show an example structure, in which cabinet 22 having printed circuit boards installed is cooled by using the forced air cooling method. A fan shelf 23 is provided below the cabinet 22, and fan unit 25 is mounted in the fan shelf. One or more fans 24 are provided in the fan unit 25. Each fan 24 is the axial type, and the blowing direction is the wind direction. That is, the outside air is forcibly introduced into the cabinet 22 by using the fans 24 in the forced air cooling method.

The cabinet 22 is not always used in a single structure, but a plurality of cabinets 22 may be stacked one on the other. In such an arrangement, the exhaust heat from a cabinet positioned at the windward side must be prevented from being drawn in by the cabinet directly above said cabinet, that is, the exhaust heat from the windward shelf should not be introduced into a cabinet positioned at the leeward side. To satisfy this requirement, air inlet 26 is provided at the suction (or draw-in) side, and air outlet 27 is provided at the exhaust side. The air inlet 26 and air outlet 27 have a structure in which the wind direction is changed using partition plate 28. The outside air is introduced from the front side of the device into the air inlet 26, while the air heated by a heated printed circuit board is expelled from the air outlet 27 to the back side of the device, so that the air in front of the device is drawn in and then expelled. According to this structure, even if a plurality of cabinets 22 are stacked, each cabinet is not affected by another shelf.

The air filter 29 whose object is dustproofing has a plate shape, in which both the dust collecting efficiency and pressure loss are uniform. The air filter 29 is inserted between the windward side of the fan unit 25 and air inlet 26, or in the inlet 26, so as to prevent dust from entering the cabinet 22 and fan unit 25. Generally, an air filter has the characteristic that the higher the speed of the wind passing through the filter, the greater the pressure loss is. Therefore, according to the basic "continuation" principle (i.e., conservation of mass) in hydrodynamics, the portion having a wider cross-sectional area of the air-flow passage has a lower wind velocity, and can be effectively used.

In the air inlet 26 having the structure (see FIG. 8) in which the wind direction can be selected using partition plate 28, the air filter may be mounted at the entrance of the inlet 26 (i.e., at the most windward side) in the vertical direction, or at the exit side of the air inlet 26, that is, directly below the fan unit 25 in the horizontal direction. In consideration of the above-described characteristics of the air filter, it is generally preferable and efficient to arrange the air filter 29 in the horizontal direction, as shown in FIGS. 7 and 8.

In addition, the air filter 29 can be detached or removed from the front side or face of the device, for maintenance such as the periodic cleaning, replacement, and the like.

Below, the operation of the conventional example will be explained.

When the fan 24 is activated so as to start the forced air cooling operation, the outside air in front of the device is forcibly introduced from the air inlet and passes through the air filter 29, so that dust included in the air is removed and the clean air flows into the cabinet 22. The air introduced into the cabinet 22 absorbs the heat from each printed circuit board 21, and the main portion of the air is expelled from the air outlet 27 towards the rear of the device while the remaining portion is expelled through gaps or crevices of the cabinet 22 to the outside. Each printed circuit board 21 is cooled by the generated air flow in the shelf.

As for the wind drawn in by axial fan 24, the spread of the ventilated area in the radial direction with respect to the rotational axis can hardly be observed in the vicinity of fan 24, and the cross-sectional area of the air flow (when passing through the air filter 29 inserted directly below the fan 24) is approximately equal to the projected area of the fan. That is, the air flow is concentrated within a limited area of the air filter 29.

In the above-explained dustproof structure employing the forced air cooling method, the air filter 29 is positioned directly below each fan 24; thus, the shorter the distance between the air filter 29 and the fan 24 is, the stronger the tendency for the air flow to concentrate within a limited area is. Due to such concentration, the dust collecting efficiency and economical efficiency are degraded, the velocity of the wind passing through the air filter 29 becomes higher, and the pressure loss becomes grater.

SUMMARY OF THE INVENTION

In consideration of the above circumstances, an object of the present invention is to provide a dustproof structure for a communication device, in which the whole area of the air filter can be effectively used, the dust collecting efficiency can be improved at low cost, and an increase in the pressure loss can be prevented.

Therefore, the present invention provides a dustproof structure of a communication device, comprising:

a shelf having an air inlet for introducing the air and an air outlet for expelling the air, wherein at least one printed circuit board of the communication device is mounted in the shelf;

at least one fan mounted in the shelf; and an air filter, provided between the fan and the air inlet, for preventing dust from entering the inside of the shelf, and wherein the outside air is drawn in by the fan through the air filter into the shelf so that the printed circuit board is cooled; and the dust collecting efficiency and the pressure loss of the air filter are not uniform, and have a distribution such that an area of the air filter closer to the fan, within which the air flow is concentrated, has a higher dust collecting efficiency, and another area farther from the fan has a lower pressure loss.

The present invention also provides a dustproof structure having a similar basic structure, but wherein the air filter comprises a first air filter section and a second air filter section, wherein the first air filter section is provided at an area closer to the fan, within which the air flow is concentrated, and the second air filter section is provided at another area farther from the fan, and the first air filter section has a dust collecting efficiency higher than that of the second air filter section, while the second air filter section has a pressure loss lower than that of the first air filter section.

Typically, the first and second air filter sections are detachably installed on the shelf.

The present invention also provides a dustproof structure having a similar basic structure, but wherein in the air filter, a plurality of air filters are layered in an area closer to the fan, within which the air flow is concentrated.

The present invention also provides a dustproof structure having a similar basic structure, but wherein in the air filter, the thickness of an area closer to the fan, within which the air flow is concentrated, is greater than that of the other area.

In the above two structures, typically, the air filter area closer to the fan and the other area are detachably installed on the shelf.

The present invention also provides a dustproof structure having a similar basic structure, but wherein in addition to said air filter, another air filter is provided at the windward or leeward side of an area closer to the fan, within which the air flow is concentrated. Typically, said air filters are detachably installed on the shelf.

In the above-described structures, typically, the fan is an axial fan.

According to the present invention, the employed air filter has the distributed dust collecting efficiency and pressure loss in a manner such that an area closer to the fan has a higher dust collecting efficiency, while another area farther from the fan has a lower pressure loss of the air flow. Therefore, an expensive air filter having a high dust collecting efficiency is only necessary for an area close to the fan, within which the air flow and dust concentrate, thereby realizing a much economical dustproof structure.

Also in the air filter, only such an important area within which the air flow and thus the dust concentrate can have a higher pressure loss; thus, the total pressure loss of the air filter can be greatly reduced and the load of the air blowing system of the communication device can also be reduced.

It is also possible to reduce the pressure loss of an area farther from the fan (that is, an area where it is preferable to have a larger air volume or rate) in comparison with the other area. That is, the distribution of the pressure loss of the air filter can be controlled, so that the distribution of the air volume in the communication device can be controlled.

In addition, the air filter can be detachably installed on the shelf; thus, during maintenance, only the area to which a high concentration of dust particles have adhered needs to be replaced, thereby improving the economical efficiency.

DETAILED DESCRIPTION OF THE PREFERRED EMBODIMENTS

Hereinafter, the embodiments of the dustproof structure according to the present invention will be explained in detail with reference to the drawings (FIGS. 1 to 6).

Figure 1:
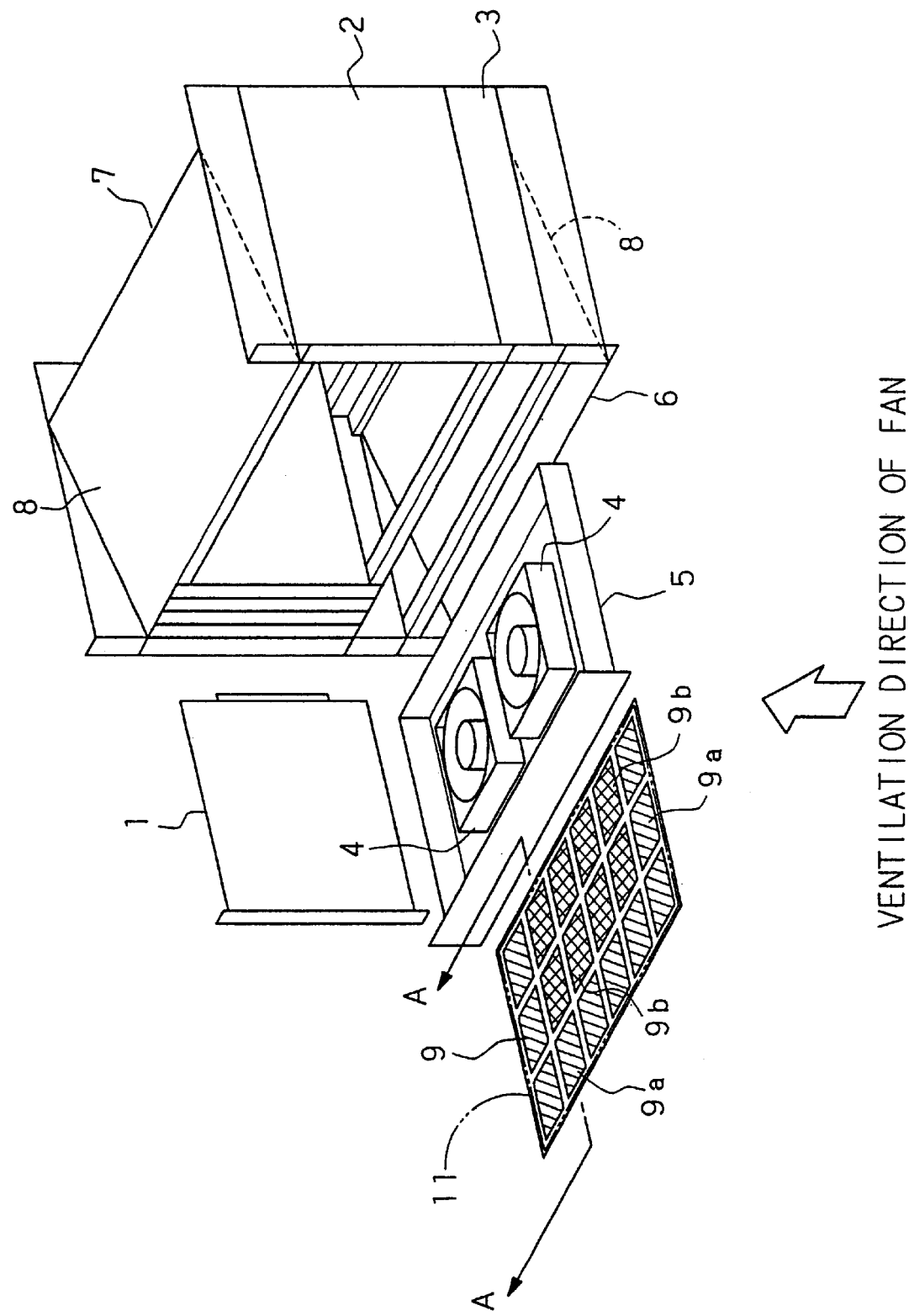
FIG. 1 is a perspective view showing the dustproof structure employed in a communication device, in an embodiment of the present invention.
Figure 2:
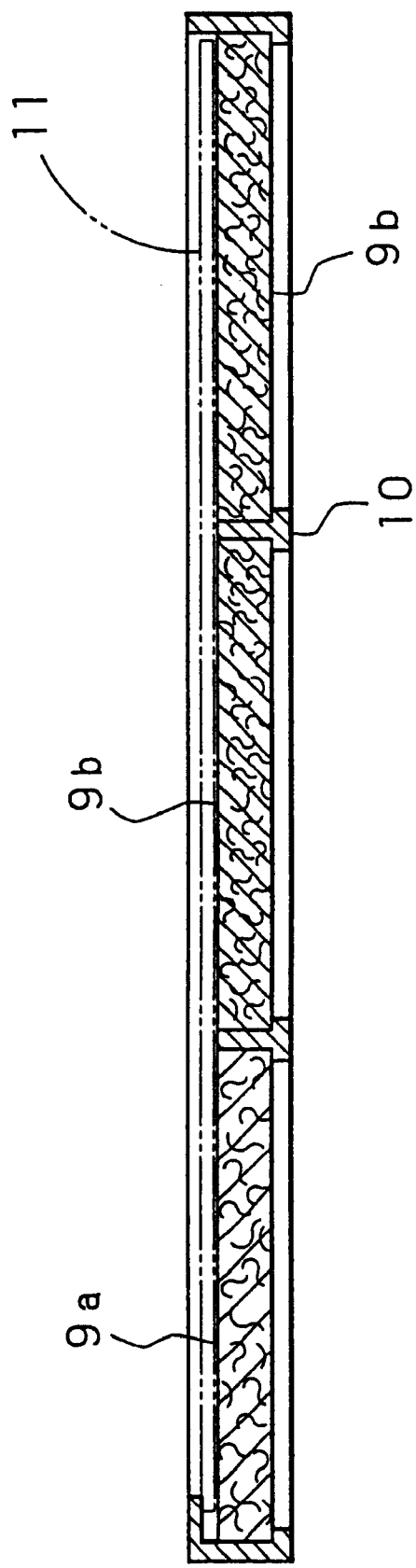
FIG. 2 is a sectional view along line A—A in FIG. 1.
Figure 3:
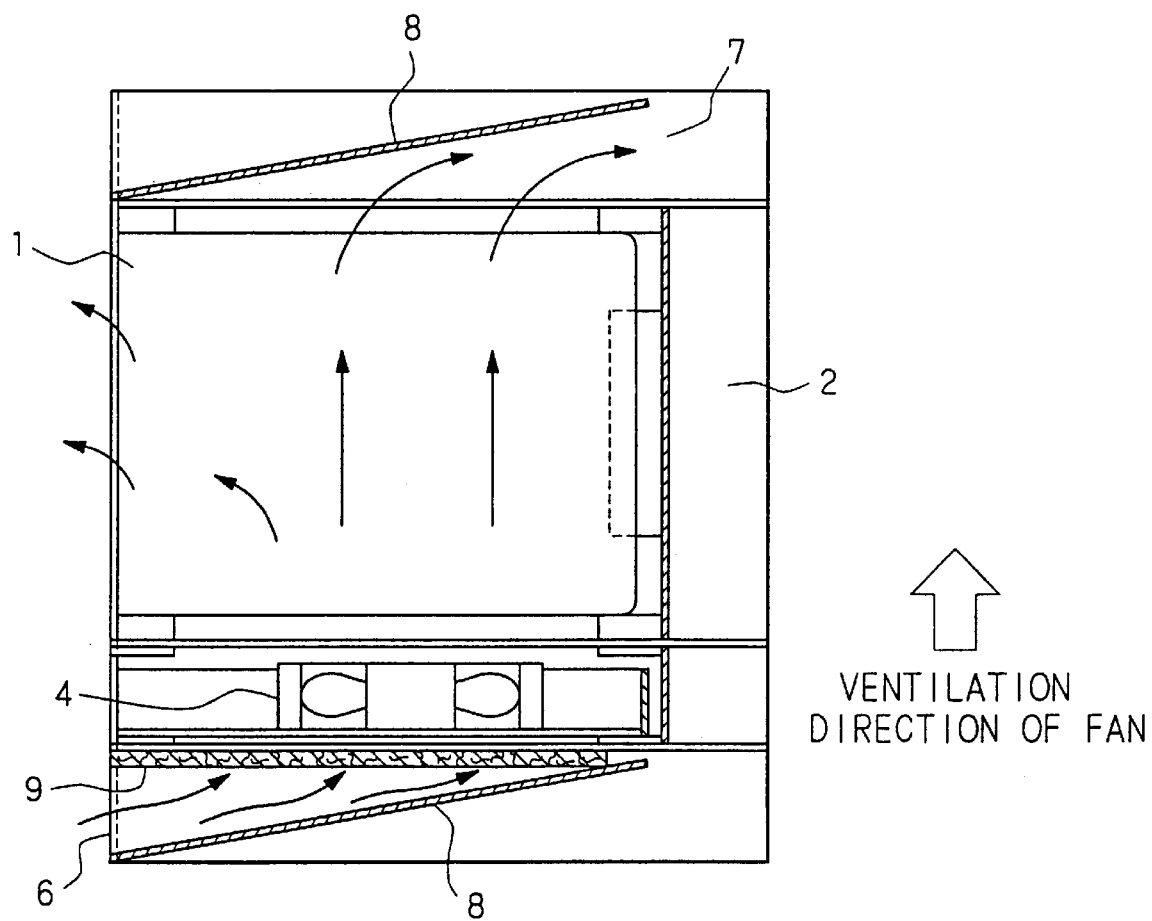
FIG. 3 is a cross-sectional view of the dustproof structure of the above embodiment.
Figure 4:
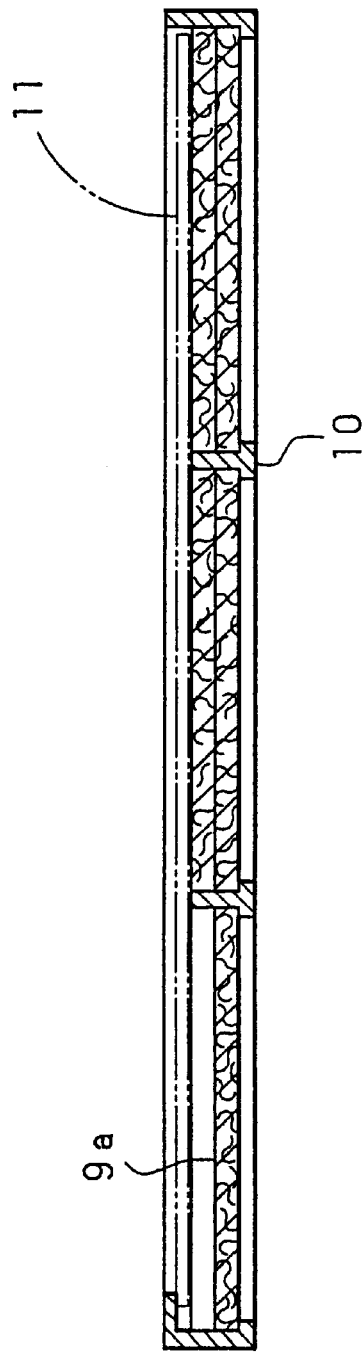
FIG. 4 is a cross-sectional view of the air filter of the dustproof structure in another embodiment of the present invention.
Figure 5:
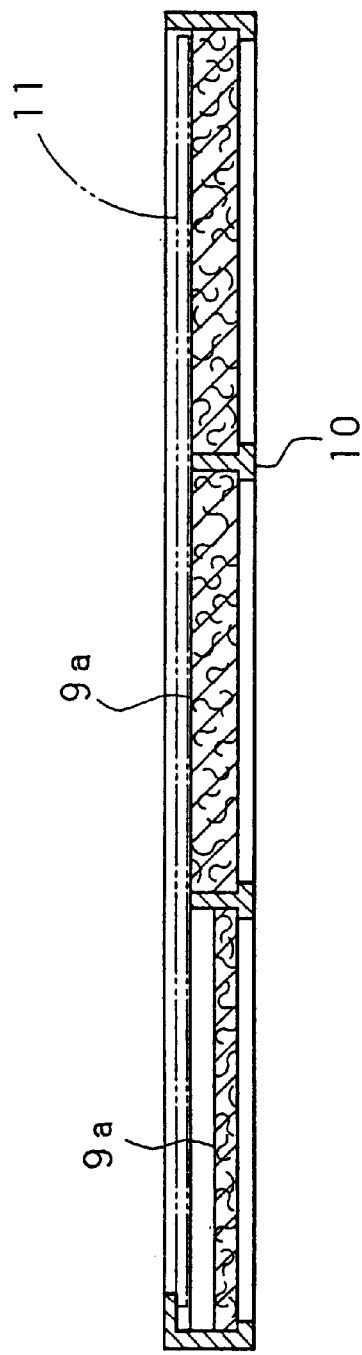
FIG. 5 is a cross-sectional view of the air filter of the dustproof structure in another further embodiment of the present invention.
Figure 6:
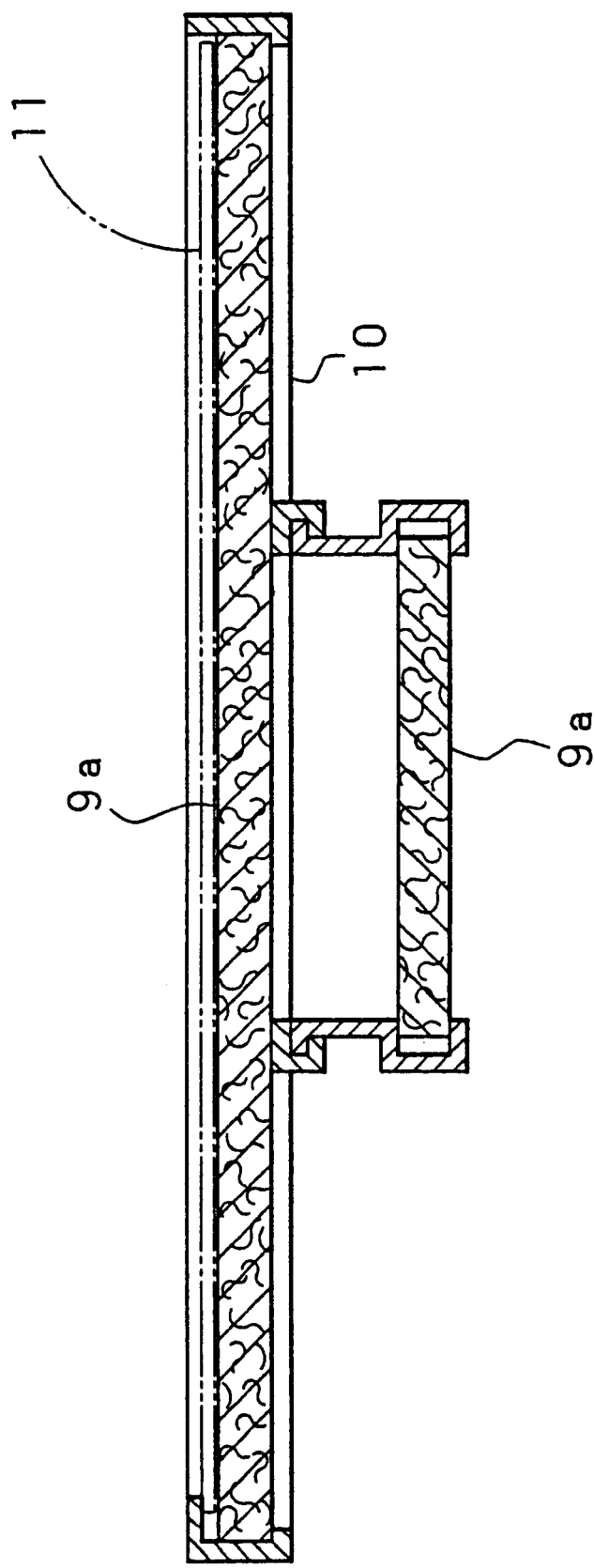
FIG. 6 is a cross-sectional view of the air filter of the dustproof structure in another further embodiment of the present invention.
Figure 7:
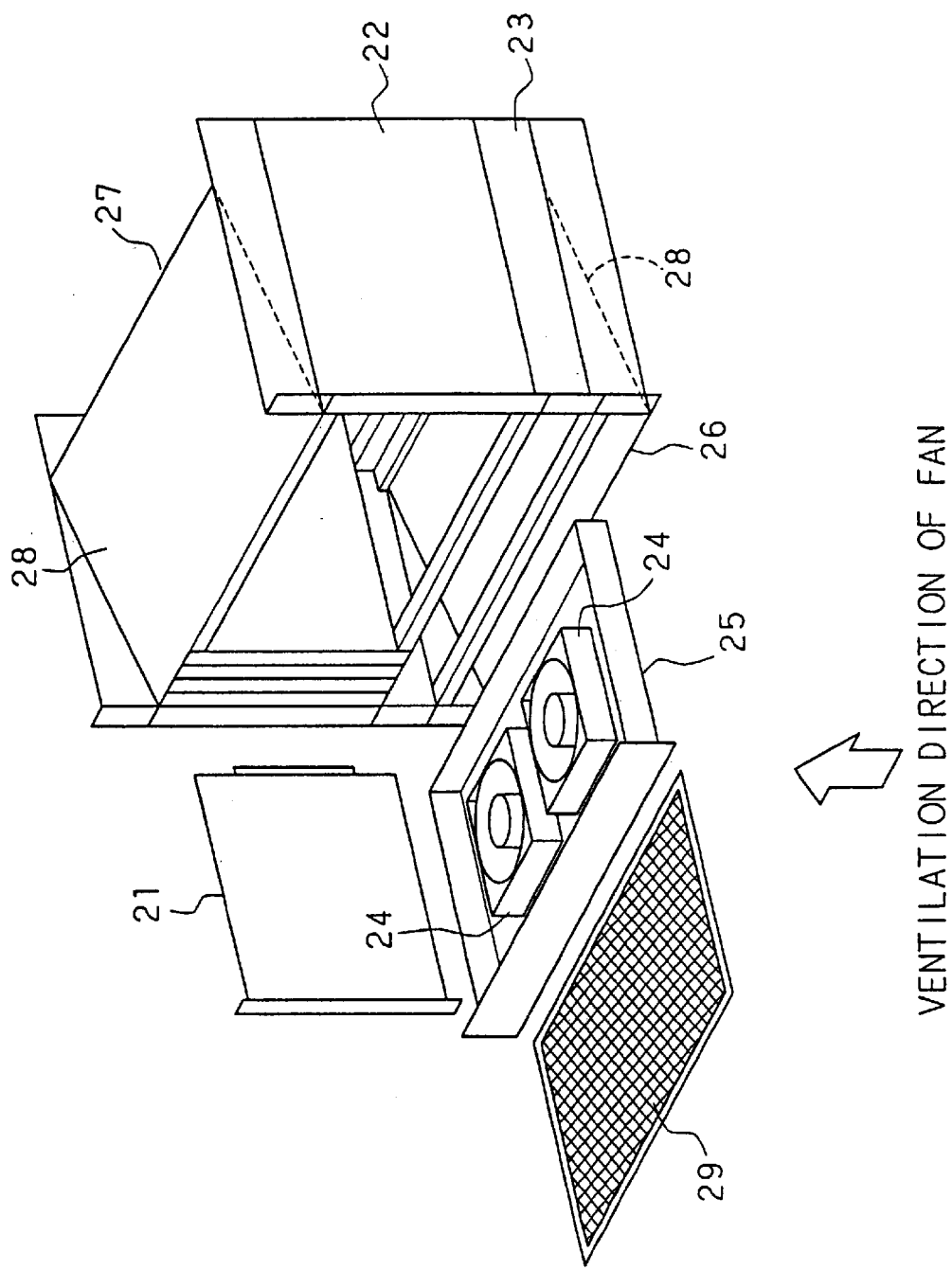
FIG. 7 is a perspective view of a conventional dustproof structure of a communication device.
Figure 8:
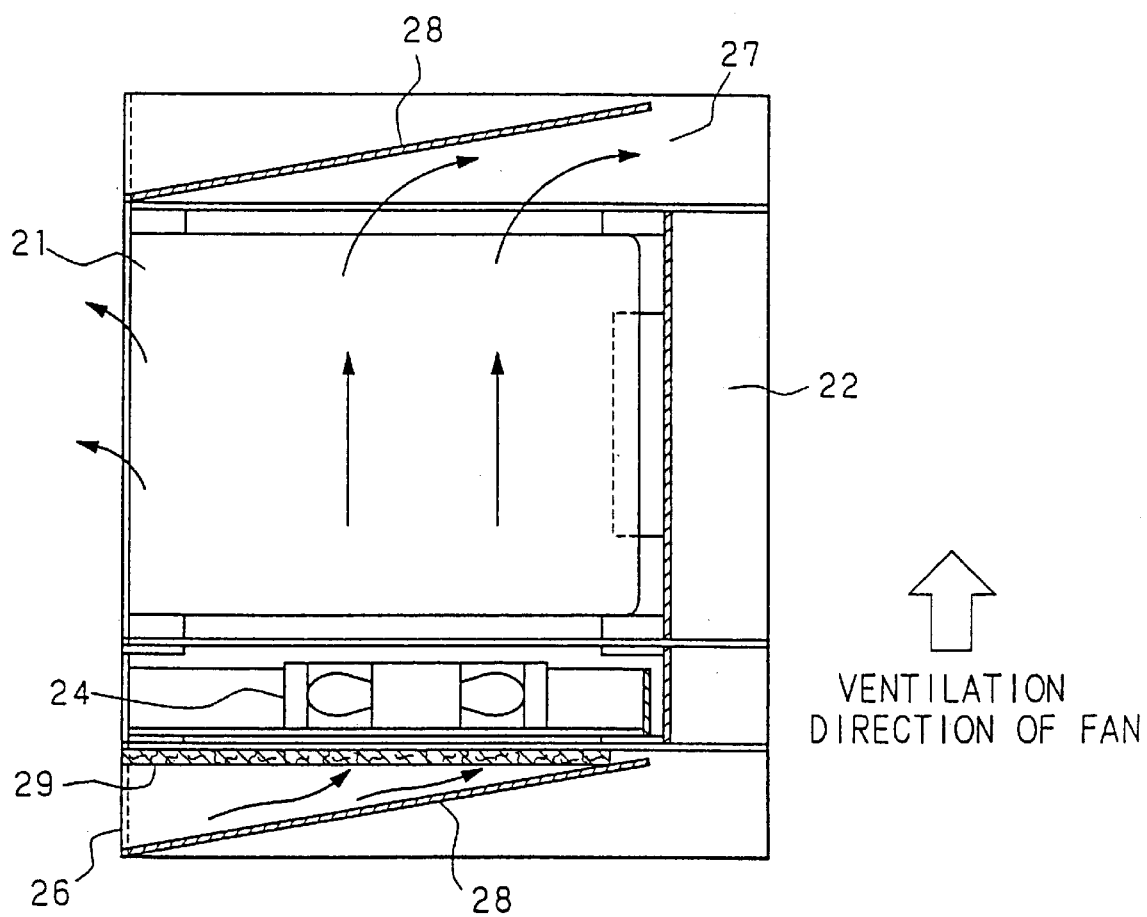
FIG. 8 is a cross-sectional view of the dustproof structure shown in FIG. 7.

FIG. 1 is a perspective view showing the dustproof structure employed in a communication device, in an embodiment of the present invention, FIG. 2 is a sectional view along line A—A in FIG. 1, and FIG. 3 is a cross-sectional view of the dustproof structure of this embodiment. FIGS. 4 to 6 respectively show cross-sectional views of the air filter of the dustproof structure in another embodiment of the present invention.

During the operation of a communication device, electronic components on each printed circuit board become heated, and this thermal stress degrades reliability. Therefore, it is necessary to cool the heated portions by natural or forced air cooling. If forced cooling having a higher cooling efficiency is used, a large number of dust particles included in the air flow into the communication device together with the air, thereby causing undesirable effects such as contact failure, insulation failure, promotion of corrosion, or the like. An air filter is provided for preventing the dust from flowing into the device.

In FIG. 1, reference numeral 1 indicates an printed circuit board, and reference numeral 2 indicates a cabinet in which a plurality of printed circuit boards 1 can be mounted. A fan shelf 3 is positioned below the shelf 2, and one or more fans 4 mounted in fan unit 5 is inserted in the fan shelf 3. Each fan 4 is an axial fan and the wind direction thereof corresponds to the blowing direction. The outside air is drawn in by the fans 4 into the cabinet 2 so as to cool the target area.

The cabinet 2 is not always used in a single structure, but a plurality of cabinets 2 may be stacked one on the other. In such an arrangement, the exhaust heat from a cabinet positioned at the windward side must be prevented from being drawn in by the cabinet directly above said cabinet, that is, the exhaust heat from the windward cabinet should not be introduced into a cabinet positioned at the leeward side. To satisfy this requirement, air inlet 6 is provided at the suction side, and air outlet 7 is provided at the exhaust side. The air inlet 6 and air outlet 7 have a structure in which the wind direction is changed using partition plate 8. The outside air is introduced from the front side of the device into the air inlet 6, while the air heated by a heated printed circuit board is expelled from the air outlet 7 to the back side of the device.

In order to prevent dust from entering the inside of the shelf 2 and fan unit 5, the air filter 9 used for the dustproof effect is positioned in the horizontal direction (i) between the windward side of the fan unit 5 and the air inlet 6, or (ii) at the most leeward side of the air inlet 6, that is, in an area having a wider cross-sectional area of the air flow.

As shown in FIG. 2, the air filter 9 in the present embodiment comprises frame 10, which is divided into a plurality of sections; air filters 9a (corresponding to the second air filter section in the present invention) and air filters 9b (corresponding to the first air filter section in the present invention) respectively and selectively attached to each section, the air filters 9a and 9b having different dust collecting efficiencies and pressure losses; and cover 11 for preventing the air filters 9a and 9b from dropping out from the frame 10. The cover 11 is a plate (such as an art metal) with a wide opening area, that is, having the minimum area necessary for preventing each air filter 9a or 9b from falling out.

Each air filter 9a is a cheap component manufactured regarding pressure loss as more important than dust collecting efficiency, that is, the air filter 9a has a lower pressure loss. In contrast, each air filter 9b is a relatively expensive and high-performance component manufactured in consideration of the dust collecting efficiency.

The air flow passing through the air filter 9 is not uniform over the whole area, and has the distribution of air volume (or rate) according to the arrangement of fans 4. In particular, the air flow mainly concentrates within the area directly below each fan 4. Therefore, the high-performance air filters 9b having a higher dust collecting efficiency are arranged in an area within which the air flow is concentrated, while the cheaper air filters 9a having a lower pressure loss are arranged in the remaining area.

In addition, the air filter 9 can be removed and detached from the front side or face of the device, for maintenance such as the periodic cleaning, replacement, and the like.

Below, the flow of the cooling air flow in the above-explained embodiment will be explained using FIG. 3.

When the fan 4 is activated so as to start the forced air cooling operation, the outside air in front of the device is forcibly introduced through the air inlet 6 and passes through the air filter 9, so that dust included in the air is removed and the clean air flows into the cabinet 2. The air introduced into the cabinet 2 absorbs the heat from each printed circuit board 1, and the main portion of the air is expelled from the air outlet 7 towards the rear of the device while the remaining portion is expelled through gaps or crevices of the cabinet 2 to the outside. Each printed circuit board 1 is cooled by the generated air flow in the cabinet.

As for the wind drawn in by each axial fan 4, the spread of the ventilated area in the radial direction with respect to the rotational axis can hardly be observed in the vicinity of the fan 4, and thus the air flow mainly concentrates within the area directly below each fan 4 and accordingly dust also increases there.

In the present embodiment, the air filters 9b are arranged in such areas within which the air flow concentrates; thus, dust is concentrated within the area of high-performance air filters 9b having a higher dust collecting efficiency.

In addition, the air filters 9a have a lower pressure loss; thus, the wind can pass through these filters 9a much more smoothly than passing through the air filters 9b having a higher pressure loss. That is, the wind also passes through the air filters 9a, and as a result, the wind passes through most of the surface of the air filter 9.

In the above-explained embodiment, two kinds of air filters 9a and 9b having different dust collecting efficiencies and pressure losses are used. However, as shown in FIG. 4, a single kind of air filters 9a may be used, and such filters may be layered in an area within which the air flow is concentrated. As another modification of using such an air filter having a uniform characteristic, the thickness of air filter 9a may be varied as shown in FIG. 5.

Furthermore, as shown in FIG. 6, a single plate main air filter 9a having a uniform dust collecting efficiency and pressure loss is used, and another detachable air filter 9a having a smaller area is also provided at the windward or leeward side of an area (of the main air filter 9a) within which the air flow is concentrated. According to this arrangement, similar effects can be obtained.

As explained above, according to the embodiments of the present invention, in a communication device having a cabinet 2 in which printed circuit boards are mounted, the forced air cooling method using fans 4 is employed so as to cool the heat generated from each printed circuit board 1. However, if the forced air cooling method is applied to a device used in a location full of dust, much of dust included in the air flows into the communication device together with the air. In order to prevent such an inflow of dust, air filter 9 is provided at the windward side of fans 4.

When the fan 4 is activated and the forced air cooling operation commences, the air is forcibly introduced into air inlet 6 and passes through the air filter 9, so that the filtered air without dust is drawn into the cabinet 2. This air introduced into cabinet 2 removes heat from each printed circuit board 1, and then is expelled through air outlet 7 to the outside of cabinet 2. The printed circuit board 1 is cooled by this air flow caused by the above operation.

Here, if the distance between each fan 4 and air filter 9 is short, the air flow passing through the air filter 9 is concentrated within a limited area directly below the fan 4. However, in the present embodiment, the air filter 9 is divided into a plurality of sections; thus, a high-performance air filter having a high dust collecting efficiency can be provided only at an area within which the air flow and thus the dust are concentrated. In addition, only an air filter or filters to which a high concentration of dust clings need to be replaced.

That is, the air filter 9 is divided into a plurality of sections, and different kinds of air filters are selectively used for an area within which the air flow is concentrated and for another area without such concentration, thereby realizing a much more economical dustproof structure having a higher dust collecting efficiency.

What is claimed is:

1. A dustproof structure of a communication device, comprising:

a cabinet having an air inlet for introducing the air and an air outlet for expelling the air, wherein at least one printed circuit board of the communication device is mounted in the cabinet;

at least one fan mounted in the cabinet; and an air filter, provided between the fan and the air inlet, for preventing dust from entering the inside of the cabinet, and wherein the outside air is drawn in by the fan through the air filter into the cabinet so that the printed circuit board is cooled; and in the air filter, the thickness of an area closer to the fan, within which the air flow is concentrated, is greater than that of the other area.

2. A dustproof structure as claimed in claim 1, wherein the air filter area closer to the fan and the other area are detachably installed on the cabinet.

3. A dustproof structure as claimed in claim 1, wherein the fan is an axial fan.

* * * * *